United States Patent [19]

Bierig

[11] 4,032,949
[45] June 28, 1977

[54] INTEGRATED CIRCUIT FUSING TECHNIQUE

[75] Inventor: Robert W. Bierig, Sudbury, Mass.

[73] Assignee: Raytheon Company, Lexington, Mass.

[22] Filed: Oct. 18, 1976

[21] Appl. No.: 733,743

Related U.S. Application Data

[63] Continuation of Ser. No. 577,805, May 15, 1975, abandoned, which is a continuation of Ser. No. 435,612, Jan. 22, 1974, abandoned.

[52] U.S. Cl. .................................. 357/51; 357/68; 357/71; 357/28; 340/166 R; 29/574

[51] Int. Cl.² .................. H01L 27/02; H01L 23/48; H01L 29/44; H01L 29/52

[58] Field of Search .................. 357/28, 51, 68, 71; 29/574; 340/166

[56] References Cited

UNITED STATES PATENTS

| | | | |
|---|---|---|---|
| 3,555,365 | 1/1971 | Forlani et al. ......................... | 357/71 |
| 3,558,989 | 1/1971 | Dameme ............................... | 357/74 |
| 3,564,354 | 2/1971 | Aoki et al. ............................ | 357/71 |
| 3,619,725 | 11/1971 | Soden ..................................... | 357/74 |
| 3,723,833 | 3/1973 | Wheatley .............................. | 357/28 |
| 3,792,319 | 2/1974 | Tsang ..................................... | 357/71 |
| 3,930,304 | 1/1976 | Keller et al. .......................... | 375/51 |

*Primary Examiner*—Andrew J. James
*Attorney, Agent, or Firm*—J. R. Inge; M. D. Bartlett; J. D. Pannone

[57] ABSTRACT

A fusing technique whereby a fuse is fabricated upon a substrate by integrated circuit techniques. Three or more layers of chemically dissimilar metals are deposited upon the region where the fuse is to be formed. The top layers are then etched away from the region where the fusible link is to be formed leaving the lower two layers, the top one of which forms the actual fusible link. The lower layer is then etched away leaving the fusible link suspended from the underlying substrate. The current necessary to cause such a fuse to blow is consistent from fuse to fuse since the physical dimensions of the fusible link can accurately be controlled with the integrated circuit techniques used and, since the fusible link is not in contact with the substrate, the rate at which heat is conducted away from the fusible link cannot vary from fuse to fuse. The method is used to advantage in microwave power and oscillator diode circuits such as those used in phasedarray radar systems and in read only memories and memory reconfiguration applications, as well as other semiconductor fusing applications.

20 Claims, 16 Drawing Figures

INTEGRATED CIRCUIT FUSING TECHNIQUE

CROSS-REFERENCE TO RELATED CASES

This is a continuation of application Ser. No. 577,805, filed May 15, 1975, now abandoned, which is a continuation of application Ser. No. 435,612, filed Jan 22, 1974, now abandoned.

Patent application, Ser. No. 402,495, filed Oct. 1, 1973 (now abandoned), and assigned to the same assignee as this invention is hereby incorporated by reference.

BACKGROUND OF THE INVENTION

The invention pertains to fuses which may be fabricated as part of an integrated circuit substrate. Such fuses are useful in such applications as microwave diode power amplifiers wherein a plurality of diodes are connected in parallel in each amplifier. In such a connection, if one of the diodes fails by short-circuiting and there is no protection, the entire amplifier also fails and becomes inoperative. By inserting a fuse in series with the DC bias connection to each of these diodes, a single diode failure will no result in catastrophic failure of the entire amplifier. In most applications, the overall unit, of which the amplifier is a part, can continue to function to a large degree with a single partially operating amplifier.

Another application where such fuses are used to advantage is where a number of power transistors in an integrated circuit in individual units are operated in parallel. In such a case, a fuse may be inserted into the emitter leg of each transistor on the semiconductor chip so that a short circuit failure of a single transistor will blow the fuse thereby removing the transistor from the circuit rather than causing the entire circuit to fail. The fuse can also serve as the emitter ballast resistor for each output power transistor by including resistive material in the fuse. In these and other applications, it is important that the current at which the fuse blows the prelictable and controllable to a great degree for proper protection of the device to which the fuse is connected. With prior art integrated circuit fusing techniques, the fuse was fabricated directly upon the semiconductor substrate. Since different regions of the underlying semiconductor substrate conduct heat to different degrees depending upon the dopant level in the semiconductor material, heat flowing directly from the fusible link into the substrate caused serious problems in the determination of the current at which the fuse would blow. Problems were also caused in that adjacent devices could be damaged by the heat flowing from the fuse into the substrate.

Many types of read only memories also employ integrated circuit type fuses. For example, in one such memory, in order to program a zero into a given memory location, it is necessary to blow a fuse at the corresponding location in the diode storage matrix on the read only memory semiconductor chip. It is especially important in that application that the fuses blow at a pre-specified current; otherwise the entire unit will be prone to failure. If the fuse were to blow at too low a current, the fuse could blow during normal device operation resulting in a change of stored data. If the fuse were to require too large a current to blow it, it would not be possible to program the correct data into the memory as a limited amount of current is typically available from driving devices used to blow the fuse.

SUMMARY OF THE INVENTION

Problems of the prior art may be overcome by the provision of fuse means mounted upon a substrate wherein the fusible link is separated from the substrate. The substrate may be an integrated circuit or transistor chip, a ceramic or ferrite base for a microwave integrated circuit, or any other application wherein a fuse may be fabricated using integrated circuit techniques. The fuse preferably has two terminals, each connected to conductive areas including conductors or semiconductor devices within or on the substrate, and a fusible link connected between the two terminals but separated from and not in physical contact with the substrate.

The fuse preferably has a first conductive layer forming the first and second terminals which are separated from one another and a second conductive layer fornming the fusible link. In some embodiments, a third conductive layer coextensive with the first and second terminals and adjacent the second layer is used. In the preferred embodiment the fusible link is fabricated platinum although chromium, titanium, molybdenum, or tungsten may be used to advantage in other embodiments. Also in the preferred embodiment, gold is used for the construction of the first and third layers.

Fuses in accordance with the present invention may be fabricated by the process of depositing coextensive layers of titanium, platinum, gold, and titanium in that order onto a substrate. The layers may be in electrical contact with one or more semiconductor devices within the substrate. A portion of the surface of the top layer of titanium is then oxidized. The remaining unoxidized portion of the top titanium layer and to coextensive portion of the gold layer are then etched as well as the coextensive portion of the lower layer of titanium thereby leaving a fusible link of platinum. A portion of the substrate may then be etched away in some embodiments of the invention to leave the appropriate semiconductor devices.

DESCRIPTION OF THE PREFERRED EMBODIMENTS

Figure 1A:
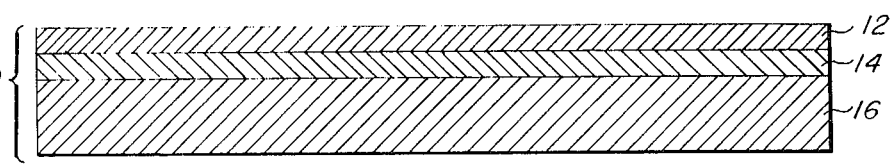
FIGS. 1A–1E are a sequence of cross-sectional drawings of fuses in accordance with the present invention in various stages of fabrication.
Figure 1B:
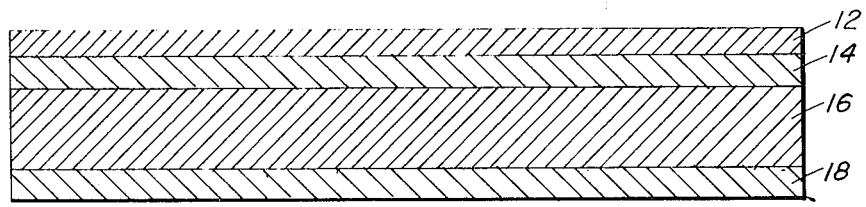
Figure 1C:
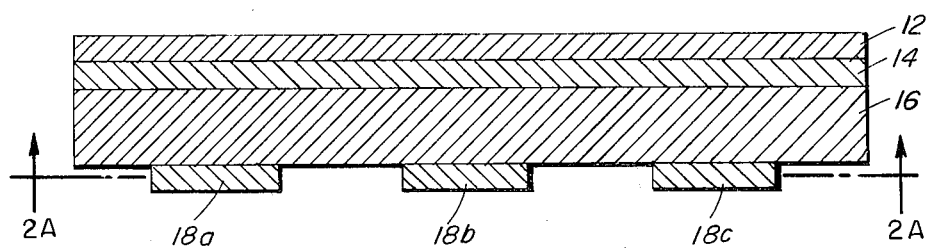
Figure 1D:
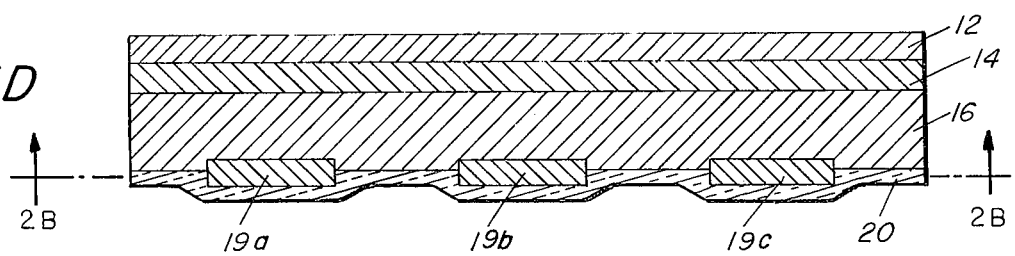

Referring now particuarly to FIGS. 1A through 1E are shown a series of cross-sectional views showing stages of fabrication of three fuses on a semiconductor substrate in accordance with the teachings of the present invention. In FIG. 1A a semiconductor body or chip 10 is formed with a diode junction between layers 14 an 16. Layer 14 may be P+ type material while bulk layer 16 is N type material. The fabrication of the semiconductor body 10 and the junction formed by layers 14 and 16 may be accomplished by well-known semiconductor processing techniques. Upon layer 14 is deposited metal conductive layer 12 which will be used for form a heat sink to conduct heat away from the diode junctions under normal operating conditions. Next, as shown in FIG. 1B, platinum layer 18 is deposited on the lower surface of layer 16. The deposition of platinum layer 18 may be accomplished by metal sputtering techniques. The platinum is then masked and etched by standard photo resistive techniques, leaving three circular regions 18a–c upon bulk layer 16 as in FIG. 1C. A plan view of the lower surface of bulk layer 16 may be seen in FIG. 2A. Platinum regions 18a–c then are sintered by heating the entire device leaving three regions of platinum silicide 19a–c extending partialy into bulk layer 16. Platinum silicide regions 19a–c are used to make contact with the diode junction through bulk layer 16. The remaining platinum which was not converted to platinum silicide in the sintering operation is removed by chemically etching away the platinum with an etchant which attacks platinum but not platinum silicide. A layer of silicon dioxide 20 is next deposited over the lower surface of layer 16 and platinum silicide regions 19a–c. This may be seen in more detail in FIG. 2B.

Figure 1E:
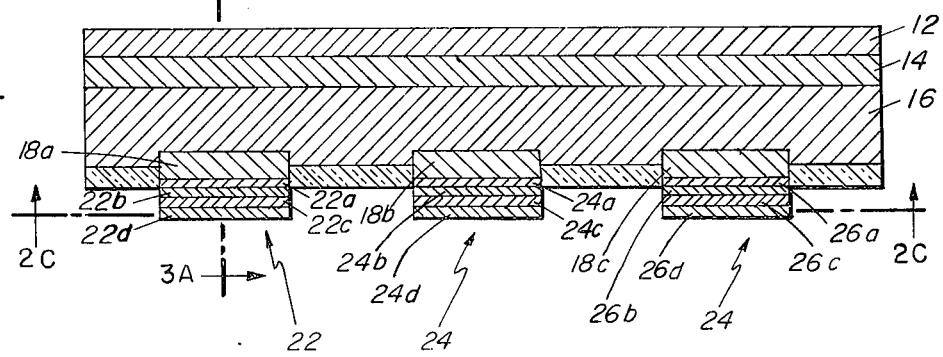
Figure 2A:
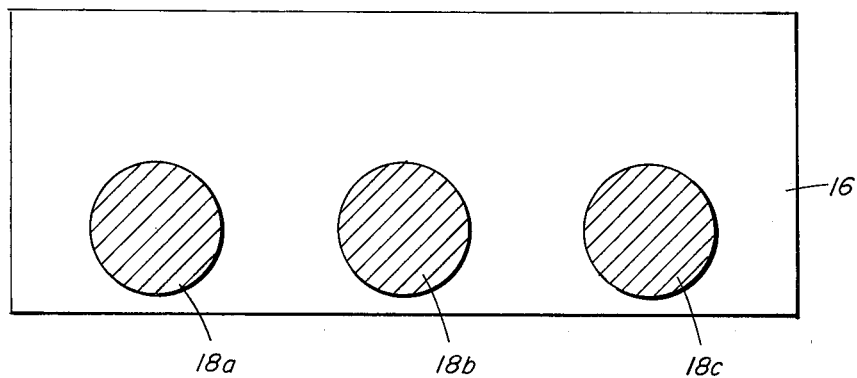
FIGS. 2A–2C are cross-sectional views of the device of FIGS. 1A–1C with the device rotated 90°.
Figure 2B:
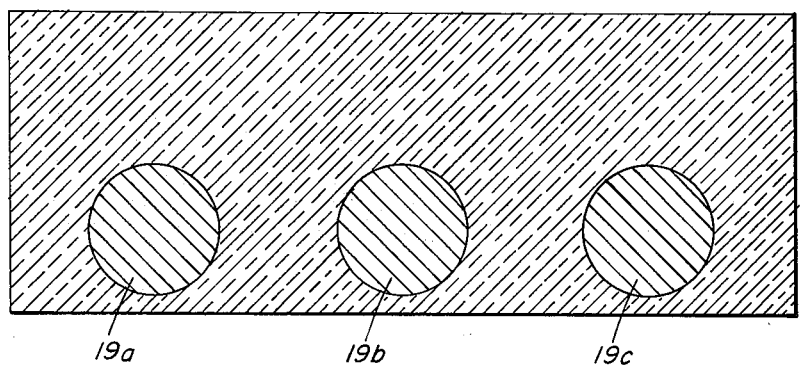
Figure 2C:
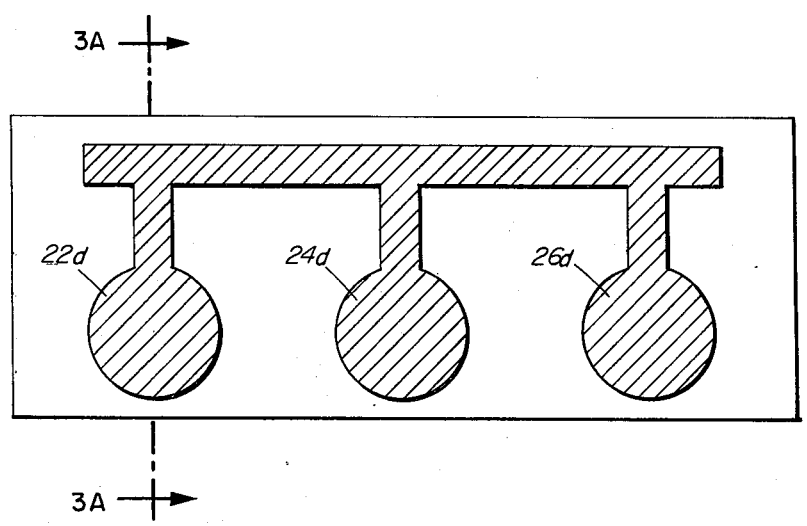

Silicon Dioxide layer 20 is next masked and etched away around each of platinum silicide region 19a–c exposing these regions. A four-layer pattern of metalization is next deposited in contact with the platinum silicide regions 19a–c and extending over a portion of silicon dioxide layer 20 as shown in FIGS. 1E and 2C. First layers 22a, 24a, and 26a are preferably titanium with a thickness in the range of 500–1000 A. Second layers 22b, 24b, and 26b, which will form the fusible links, are preferably platinum with a thickness in the range of 1000–4000 A, the thickness depending upon the current at which the fuses to be fabricated are designed to blow. Third layers 22c, 24c, and 26c are preferably gold with approximately the same thickness as second layers 22b, 24b, and 26b. Fourth layers 22d, 24d, and 26d are preferably titanium wit a thickness of approximately 1000 A. Each of these layers are deposited sequentially using well-known metal sputtering techniques.

Figure 3A:
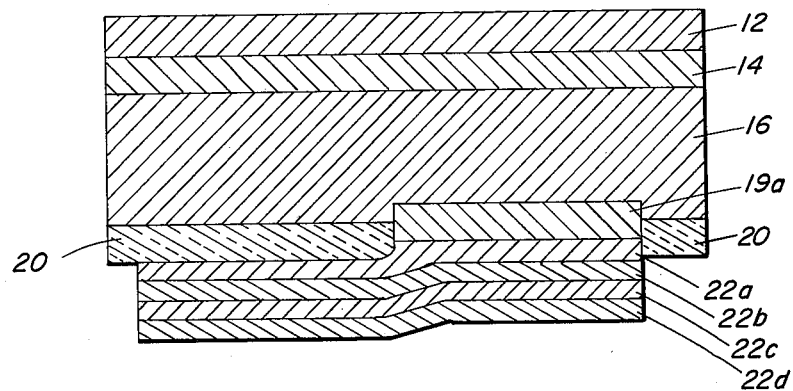
FIGS. 3A–3C are cross-sectional views of a fuse in accodance with the present invention showing further details of fabrication.
Figure 3B:
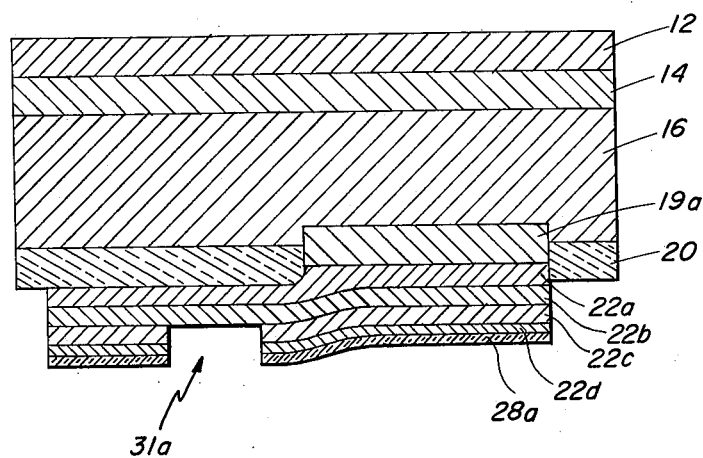

In FIG. 3A is shown a cross-sectional view of one of the diode and fuse regions of FIG. 2C. The view of FIG. 3A is enlarged over of FIG. 2C to show in greater detail the construction of the fuse and its connection to platinum silicide region 19a. After fabrication has proceeded as far as shown in FIGS. 2C and 3A, the surface of first layer 22d is oxided for titanium to titanium dioxide forming layer 28a except in the region where the fusible link is to be formed. For this purpose, photo resistive material is deposited above the region where the fusible link is to be formed and oxygen is sputtered onto the exposed surface of titanium fourth layer 22a. The photo resistive material is then stripped away and the underlying portions of titanium third layer 22c and gold third layer 22c are sputter etched away leaving opening 31a exposing platinum third layer 22b in the region where the fusible link is to be formed. This portion of the process is illustrated more particularly in FIG. 3B.

Figure 3C:
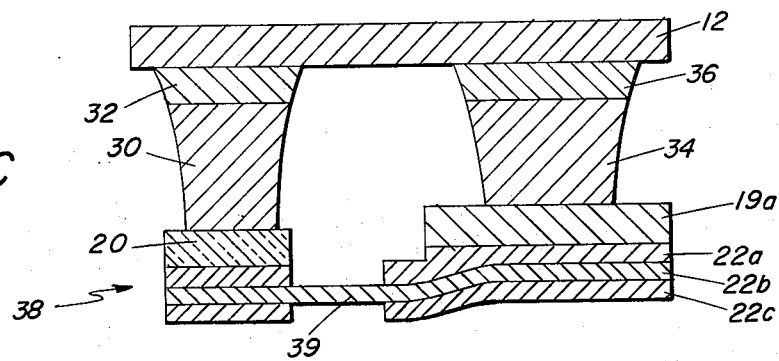

The final fabrication of fusible link 39, as shown in FIG. 3C, is accomplished by etching away titanium dioxide layer 28a and the remaining portion of titanium layer 22d, as well as etching away that portion of titanium first layer 22a between silicon dioxide layer 20 and fusible link 39. Finally, after masking the fuse except in the region of fusible link 39, the semiconductor material of layers 16 and 14, as well as a portion of silicon dioxide layer 20 are etched away leaving the mesa structures shown in FIG. 3C. The diode is formed by remaining mesa layers 34 and 36 supported by metal layer 12 and contacted through platinum silicide layer 19a and layers 22a–c through fusible link 39 to buas 38 formed by the portions of layers 22a–c which lie over the remaining portion of silicon dioxide layer 20. Bus 38 interconnects the three diodes supplying DC bias to one terminal of each. The remaining portions of silicon dioxide layer 20 electrically insulates bus 38 from semiconductor supports 30 and 32.

As is evident from FIG. 3C, fusible link 39 is supported away from any neighboring semiconductor material so that heat dissipated in fusible link 39 will not be conducted to the semiconductor substrate. Hence, the current required to blow fusible link 39 is independent of the type or degree of thermal or electrical conductivity of any surrounding semiconductor material. Moreover, when fusible link 39 does blow, there is little danger that any of the metal which formed fusible link 39 will splatter onto an active junction area as it is supported away and isolated from any such areas.

Other types of material other than platinum may be used for fusible link 39. As disclosed in the above referenced and incorporated application, chrominum, titanium, molydbenum, or tungsten when used for a fusible link will form a dielectric or nonconductive residue when heated to a sufficient temperature to cause melting. Use of such materials with the present invention will insure that no short circuits across the link, semiconductor junctions, or other circuits will be formed when the fuse blows.

Figure 4A:
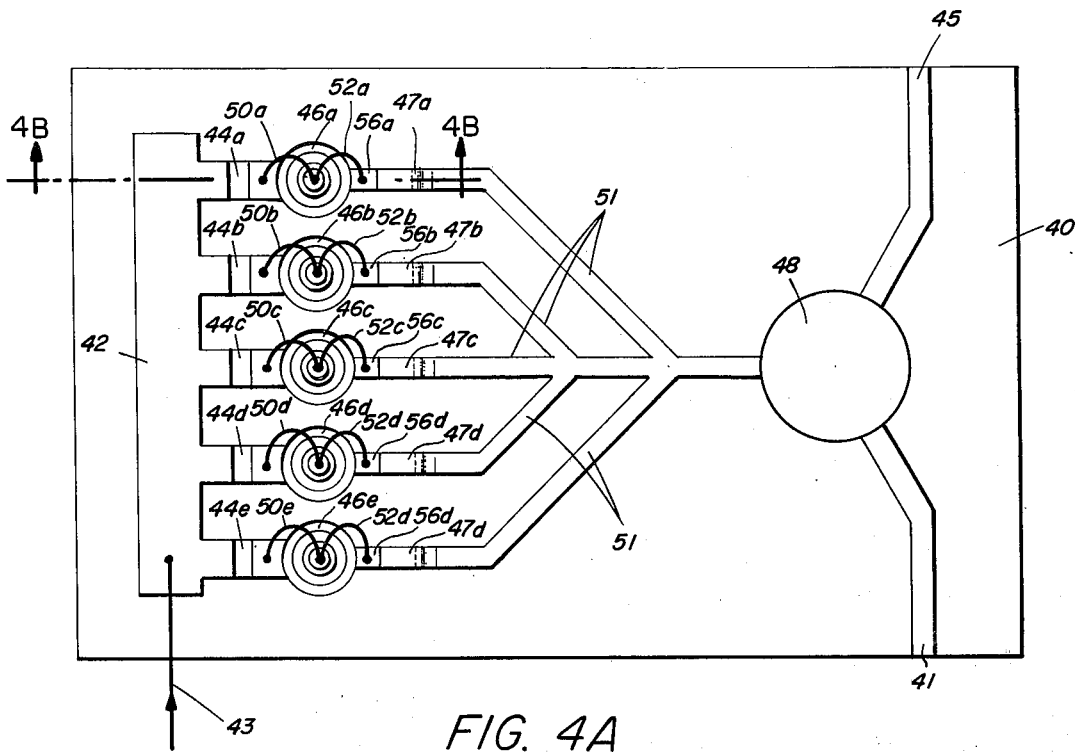
FIG. 4A is a plan view of a microwave integrated circuit amplifier employing fusing techniques in accordance with the present invention.
Figure 4B:
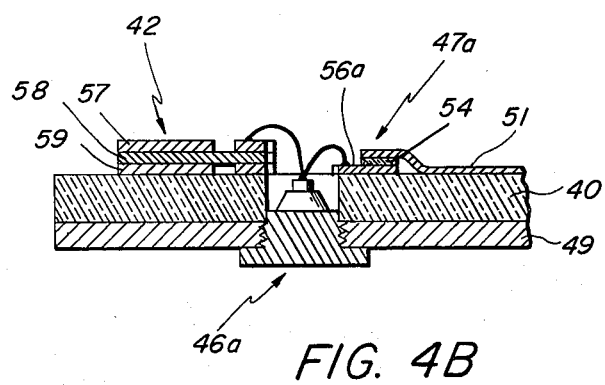
FIG. 4B is a cross-sectiona view of a portion of FIG. 4A showing the details of construction of the fuse and its interconnections with the accompanying circuit.

Referring now to FIGS 4A and 4B there is shown an spplication of fuses constructed in accordance with the present invenion in a multiple diode microwave parametric amplifier. Such amplifiers are commonly used as microwave power amplifiers in phased array radar systems for both transmitting and receiving, as well as in numerous microwave communications applications for voice, data, or other intelligence.

Ceramic substrate 40 provides support for the interconnection metallization, fuses 44a–e, and microwave circulator 48 upon its top surface, as well as for diodes 46a–e and ground plane 49 mounted from below. Bias for diodes 46a–e is provided on line 43 which is connected to an external DC power source through bus 42. Diodes 46a–e, each mounted upon a stub which screws into metal ground plane 49, are microwave parametric amplifying diodes such as IMPATT diodes.

Incoming microwave signals which are to be amplified are coupled on input strip line conductor 41 to microwave circulator 48. The signals are then directed by microwave circulator 48 through strip lines 51 to DC blocking capacitors 47a–e which remove the DC bias voltage supplied by line 43 through bus 42, fuses 44a–e, leads 50a–c to diodes 46a–e, and leads 52a–e. Blocking capacitors 47a–c each include a block of ceramic material 54, with a length of one-half the center frequency of he signals, sandwiched between strip line conductors 51 and 56a–e. Leads 50a–c connect diodes 46a–e to fuses 44a–e and hence to the DC bias voltage on bus 42. The amplified signals are coupled back from diodes 46a–e through leads 52a–c and DC blocking capacitors 47a–c back along strip line conductors 51 to microwave circulator 48 which directs the amplified signals through strip line conductor 45 to the output. Strip line conductors 41, 45. 51, and 56a–c, as well as microwave circulator 48, each comprise regions of highly conductive material such as copper, preferably plated with gold for low microwave losses. Additionally, as is well known in the microwave circulator art, a body of ferrite material is located below microwave circulator 48.

Each of fuses 44a–e is constructed in accordance with the procedure detailed in the discussion above of FIGS. 1A–E, FIG. 2C, and FIGS. 3A–C, as adapted for this particular application. The four layer metallization pattern is deposited upon the surface of ceramic substrate 40 where each fuse 44a–e and bus 42 are to be constructed. As described previously, the top layer of titanium is masked with photoresistive material and sputtered with oxygen. The photoresistive materials is then removed and the upper layer of titanium and next succeeding layer of gold are sputter etched away above the fusible link and the titanium dioxide removed. Lastly, the lower layer of titanium is etched away in the region of the fusible link leaving the fusible link suspended away from the substrate.

Fuses, in accordance with the present invention, are particularly well adapted for use in the illustration of FIGS 4A and 4B in that they may be constructed along with the metallization patterns for the microstrip conductors. Also, fuses in accordance with the present invention are used to advantage in that application, since it is important that the current at which each fuse will blow be carefully controlled so that a diode which has failed by short-circuiting can quickly be removed from the circuit. The current at which fuses constructed in accordance with the present invention blow is readily controllable since that current is determined by the physical dimensions of the fusible link, all of which are closely controllable by the integrated techniques described. For the circuit of FIG. 4A, the failure of a single diode will not bring about catastrophic failure of the entire unit. The unit can continue to function at reduced power until it can be replaced, the fuse saving the entire unit from failure.

Any member of diodes such as diodes 48a–e may be used, as five are shown by way of illustration only. Furthermore, several such diode amplifiers as shown in FIG. 4A may be cascaded or connected in parallel for additional power gain.

Figure 5:
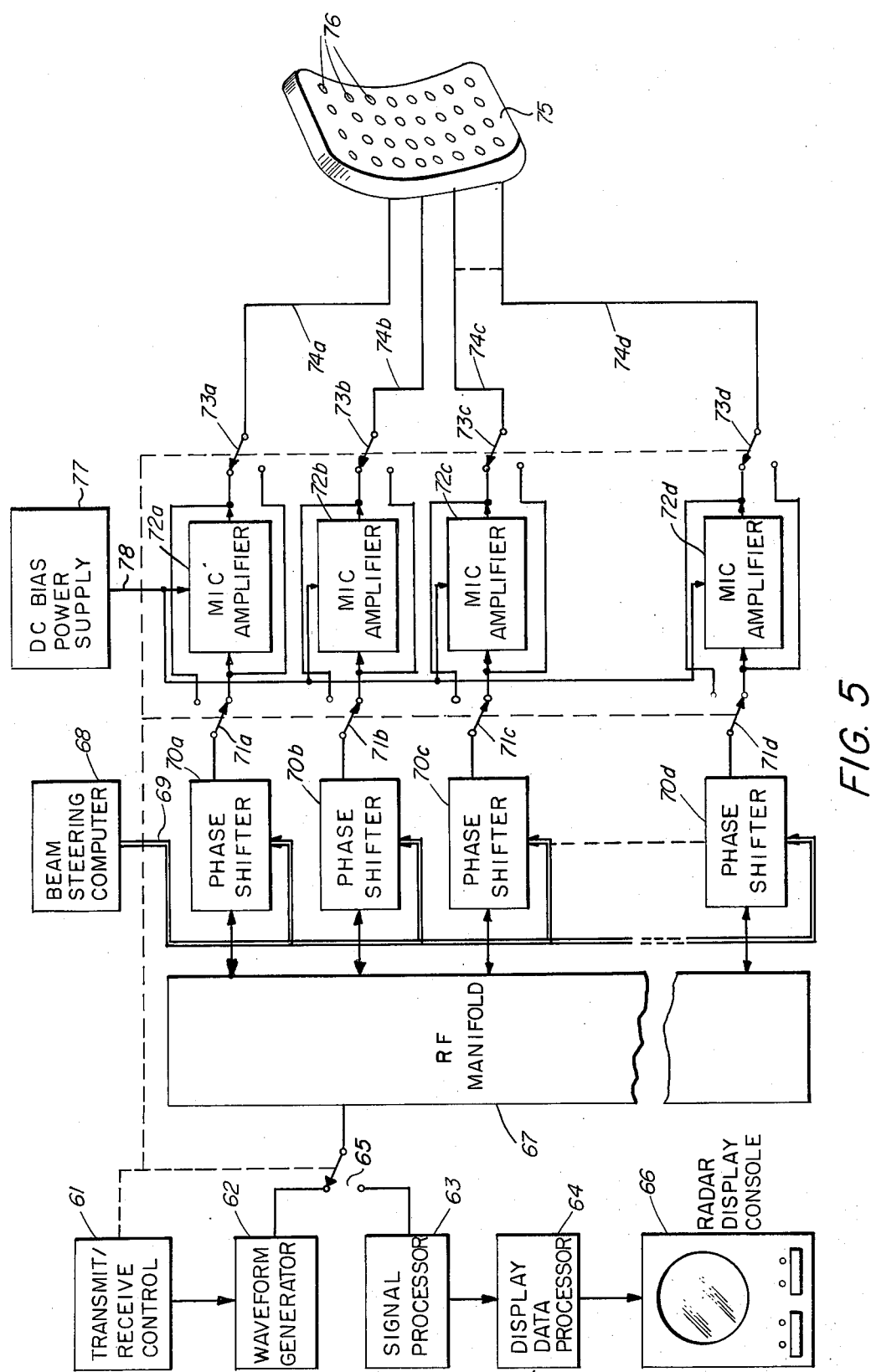
FIG. 5 is a schematic diagram of a phased array radar system in which the present invention is used to advantage.

In FIG. 5 is shown a phased array radar system embodying amplifiers and fuses such as illustrated in FIG. 4A. Transmit/receive control 61 controls switching between the transmit and receive modes of operation and triggers waveform generator 62 at the beginning of the transmit mode. Transmit/receive control 61 operates transmit/receive switches 65, 71a–d, and 73a–d, each of which is preferable to an electronic or ferrite switch, but which are shown here generically for clarity of illustration. Each of switches 65, 71a–d, and 73a–d is shown in the transmit position. After waveform generator 62 has been triggered by transmit/receive control 61, it generates a transmission signal such as a chirped waveform or other waveform commonly used in radar transmission. This signal is coupled through RF manifold 67 and distributed to phase shifters 70a–d. Beam steering computer 68, after computing the desired angle at which the radar pulse is to be transmitted, produces phase shift control signals on lines 69 setting the phase shift to be introduced by each of phase shifters 70a–d. The phase shifted signals are then coupled through switches 71a–d to the inputs of microwave integrated circuit ampifiers 72a–d each of which is preferably an amplifier as illustrated in FIG. 4A including therein fuses constructed in accordance with the teachings of the present invention. Of course, cascade or parallel combinations of the amplifiers of FIG. 4A may be used for each microwave integrated circuit amplifier 72a–d. DC bias power supply 77 supplies DC bias to each of the microwave integrated circuit amplifiers 72a–d and the diodes therein on line 78. The amplified signal from microwave integrated circuit amplifiers 72a–d is coupled through switches 73a–d to phased array radar antenna 75. Each of the outputs of the microwave integrated circuit amplifiers is coupled to a separate antenna element 76 which may be a thousand or more in number depending upon the particular application. For simplicity, only four of the accompanying microwave integrated circuit amplifiers are shown in FIG. 5.

In the receive mode of operation, transmit/receivecontrol 61 causes switches 65, 71a–d, and 73a–d to the opposite position from that illustrated in FIG. 5. The received signals are intercepted by antenna elements 76 and are coupled back through lines 74a–d to the inputs of microwave integrated circuit amplifiers 72a–d. The outputs of microwave integrated circuit amplifiers 72a–d are then coupled back through phase shifters 70a–d with the same phase shift given to each signal as was introduced for the transmitting operation. The phase shifted received signals are coupled back through RF manifold 76 to signal processor 63 which provides detection and amplification for the received signals producing an analog video output signal. The video output signal is then coupled to data processor 64 where the signal is processed for visual display by radar display console 66.

If one of the diodes in one of microwave integrated circuit amplifiers 72a–d should fail by short-circuiting, its accompanying fuse will quickly remove it from the circuit and prohibit the entire amplifier from failing. The result will be that the amplifier will have slightly less gain and consequently the output signal from the phased array antenna 75 will be steered to a very slightly different direction. However, for most applications the difference will be indiscernible and the radar system can continue to function essentially at full capability until the failed amplifier can be replaced. Were fuses in accordance with the present invention not present at each diode, the entire amplfier would fail and the entire radar system would become inoperative.

Figure 6:
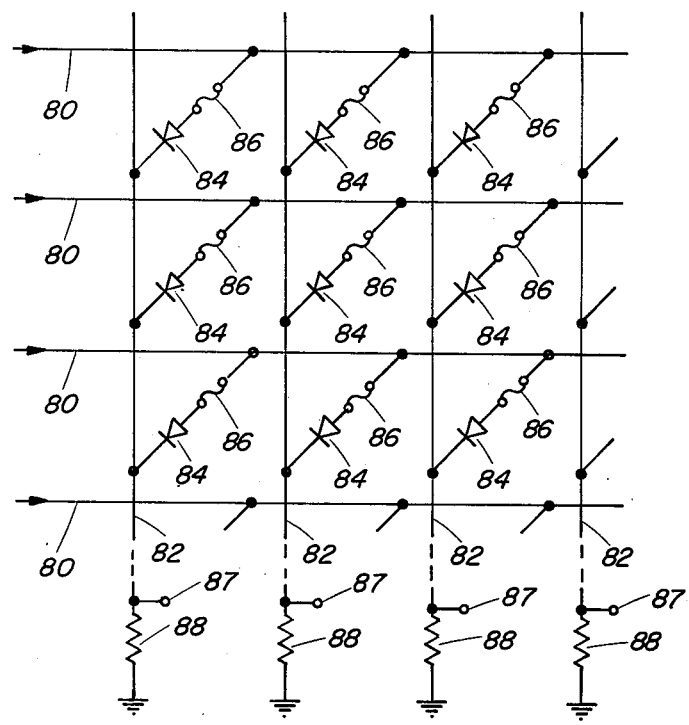
FIG. 6 is a schematic diagram of a portion of a read only memory in which the present invention is used to advantage.

In FIG. 6 is shown a portion of a read only memory in which the present invention is used to advantage. The memory is formed by a plurality of intersecting horizontal and vertical conductors, each intersection representing a storage location in the memory. Between horizontal and vertical conductors at each intersection is located a series connected fuse 86 and diode 84. If a logical "1", represented by a positive voltage with respect to ground, is to be stored in a given memory storage location, the fuse 86 at the corresponding intersection is left intact. If a logical "0", represented by zero voltage, is to be stored in that location, the fuse 86 at that intersection is blown, causing an open circuit. Data stored in the memory is read out onto the vertical conductors one row at a time by impressing a positive voltage on the horizontal conductor corresponding to the row to be read out. Current flows through diodes 84 and fuses 86 at intersections where a fuse 86 has been left intact through an output load resistor 88, causing the impressed positive voltage to appear at the corresponding output terminal 87. On the other hand, if a fuse 86 has been blown, no current then will flow at that intersection and, hence, there will be zero or ground potential on the corresponding output terminal 87.

The entire memory may be fabricated on an integrated circuit "chip" with the fuses constructed in accordance with the present invention by integrated circuit techniques. Use of fuses in accordance with the present invention is particularly advantageous with this read only memory application because of the precise control that can be placed upon the current at which the fuses will blow combined with the ease of fabrication as part of the integrated circuit made possible with the invention. Of course, other programmable memory configurations and circuits could be used, the one chosen for illustration being for reasons of simplicity. For example, transistor circuits could be used at each intersection with a fuse in accordance with the present invention being used to determine the output from the transistor circuit when the circuit is coupled to the memory output.

Figure 7:
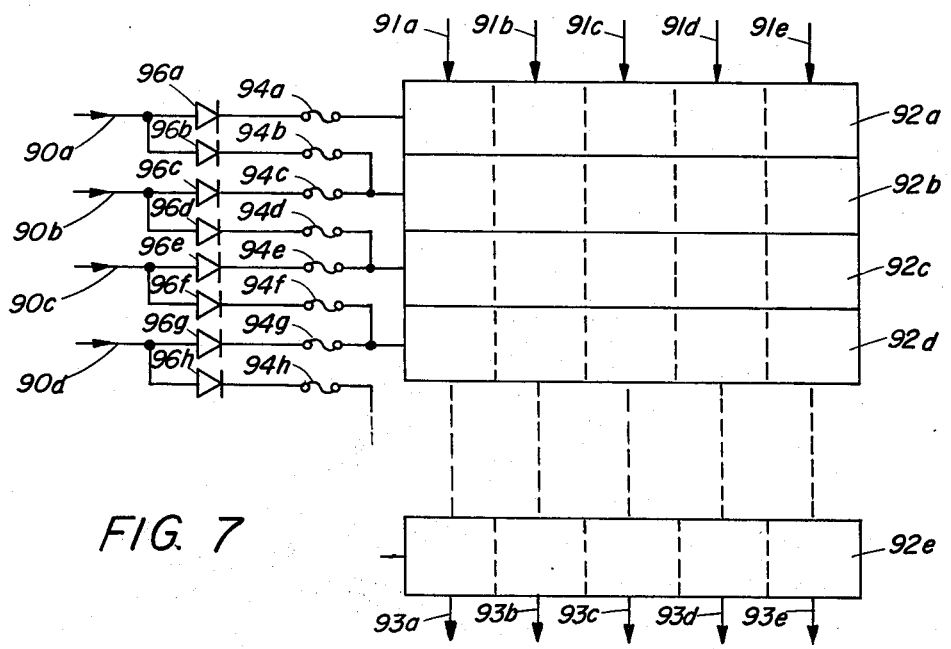
FIG. 7 is a schematic diagram of a reconfigurable random access memory in which the present invention is used to advantage.

FIG. 7 illustrates the use of diodes constructed in accordance with the present invention in a random access memory reconfiguration circuit application, wherein a row in the memory within which a bit failure has occurred is disconnected from the circuit and another is substituted in its place. The technique is particularly applicable in the manufacture of such memories to improve the yield that can be obtained. If each bit position in each of rows 92a–d is functioning properly, input address line 90a will be coupled through diode 96a and fuse 94a to the input to row 92a, thus causing the contents of row 92a to be read in from input lines 91a–e or read out to lines 93a;14 e when line 90a is activated. Similarly, line 90b is coupled through diode 96c and fuse 94c to row 92b, line 90c through diode 96c and fuse 94c to row 92c, and line 90d through diode 96g and fuse 94g to row 92d. Further input lines would be connected in the same manner. Fuses 94b, d, f, and h would then be blown to isolate the inputs from one another.

If, after testing, it has been determined that one of the bit locations is malfunctioning, such as the position marked "X" in row 92b, the fuses may be used to reconfigure the memory by connecting each input line including and futher in sequence than the line opposite the failed row to the next succeeding row and connecting the last input line in sequence to a spare row. The input above the failed row will remain coupled to their opposite rows. Line 90a will be coupled through diode 96a and fuse 94a to row 92a as before. Fuse 94b will be blown. Instead of line 90b being coupled through diode 96c and fuse 94c to row 92h as before, fuse 94c will be blown and line 90b will be coupled through diode 96d and fuse 94d to row 92c. Similarly, line 90c will be coupled through diode 96f and fuse 94f to row 92d and fuse 94c will be blown. Each successive input line will be similarly configured with the last input line being coupled to a spare row. Of course, any number of rows and spare rows may be provided.

Several methods are available for blowing the fuses. External probes can be connected to the fuse terminals and sufficient current applied. Other connections to the fuses through a second set of diodes can be made on the chip to provide current to blow the diodes. The fuse links can be alternated in types of material used on in physical dimensions so that an external current pulse applied to one of the input lines will blow only one of the two fuses connected to that input line. Fuses in accordance with the present invention are particularly suited for the latter method since, as set forth above, the current which it takes to blow them can be easily determined. Furthermore, with a larege number of fuses to be blown in one area of a semiconductor chip, the present invention is advantageously used to prevent unwanted short circuits from occurring.

This completes the description of the preferred embodiments of the invention. Although preferred embodiments of the invention have been described, numerous modifications and alterations would be apparent to one skilled in the art without departing from the spirit and scope of the present invention.

What is claimed is:

1. In combination:
   an integrated circuit substrate having a plurality of conductive regions on at least one surface thereof; and
   fuse means upon said surface, said fuse means having first and second terminals and a fusible link, said fusible link being coupled between said first and second terminals, said first and second terminals each forming a portion of at least one of said conductive regions, and said fusible link being suspended between said first and second terminals, said fusible link being substantially coplanar with adjacent portions of said first and second terminals, the density of current through said fusible link being substantially uniform, and lateral surfaces of said fusible link being separated from any layers of solid material.

2. The combination of claim 1 wherein said substrate comprises an integrated circuit chip.

3. The combination of claim 1 wherein said substrate comprises a ceramic base of a microwave integrated circuit.

4. The combination of claim 1 wherein said fuse means comprise in combination:
   a first conductive layer comprising two separated regions; and
   a second conductive layer adjacent to said first layer, second layer comprising said fusible link.

5. The combination of claim 4 further comprising a third conductive layer comprising two separated regions, said third layer being adjacent to said second layer and said two separated regions being coextensive with said first and second terminals.

6. The combination of claim 4 wherein said first layer comprises titanium.

7. The combination of claim 4 wherein said second layer comprises platinum.

8. The combination of claim 4 wherein said second layer is selected from the group consisting of chromium, titanium, molybdenum, and tungsten.

9. The combination of claim 5 wherein said third layer comprises titanium.

10. An integrated circuit fusing system comprising in combination:
   first and second base layers of conductive material upon an integrated circuit substrate, said first and second base layers being separated from one another, and at least one of said base layers forming at least a portion of means for interconnecting circuit elements; and
   fusible link, said fusible link being coupled to said first and second base layers, said fusible link being suspended between said first and second base layers and suspended from said substrate, said fusible link being substantially planar, the flow of current through said fusible link being substantially uniform in density and direction, and lateral surfaces of said fusible link being separated from any laters of solid material.

11. The combination of claim 10 further comprising a substrate.

12. The combination of claim 1 wherein said substrate comprises an integrated circuit chip.

13. The combination of claim 12 wherein said fusible link is suspended from the surface of said integrated circuit.

14. The combination of claim 13 wherein said fusible link extends substantially over said first and second base layers.

15. The combination of claim 14 wherein said fusible link comprises platinum.

16. The combination of claim 15 further comprising first and second covering layers adjacent said fusible link, said first covering layer being substantially coextensive with said first base layer and said second covering layer being substantially coextensive with said second base layer.

17. The combination of claim 16 wherein said first and second base layers comprise titanium and said first and second covering layers comprise gold.

18. An integrated circuit device including a plurality of semiconductor devices operatively coupled in parallel with fuse protection for each of said semiconductor devices comprising in combination:
   a plurality of substantially identical semiconductor devices, each of said semiconductor devices comprising a plurality of layers of semiconductor material in a mesa shape;
   means for electrically coupling together a first terminal of each of said semiconductor devices; and
   fuse means coupled to a second terminal of each of said semiconductor devices, said fuse means each having first and second terminals, said first terminal of each of said fuse means being coupled to a second terminal of a corresponding one of said semiconductor devices, said second terminal of said fuse means being electrically coupled together, and said fuse means having a fusible link coupled between said first and second terminal of said fuse means, said fusible link being suspended in air, said fusible link being substantially coplanar with adjacent portions of said first and second terminals of said fuse means, and lateral surfaces of said fusible link being separated from any layers of solid material.

19. The combination of claim 18 wherein: said semiconductor devices each comprise diodes.

20. The combination of claim 18 wherein: said fusible link consists of a material selected from the group of platinum, chromium, titanium, molybdenum, and tungsten.

* * * * *

UNITED STATES PATENT OFFICE
CERTIFICATE OF CORRECTION

Patent No. 4,032,949           Dated  June 28, 1977

Inventor(s)  Robert W. Bierig

It is certified that error appears in the above-identified patent and that said Letters Patent are hereby corrected as shown below:

Column 1, line 24: change "no" to -- not --;
          line 41: change "the prelictable" to -- be predictable --;
Column 2, line 20: change "fornming" to -- forming --;
          line 23: after "fabricated" insert -- from --;
          line 35: change "to" to -- the --;
          line 56: change "cross-sectiona" to -- cross-sectional --;
Column 3, line 10: change "an" to -- and --;
          line 16: change "for" to -- to --;
          lines 27-28: change "partialy" to -- partially --;
          line 53: change "wit" to -- with --;
          line 59: after "over" insert -- that --;
          line 63: change "oxided for" to -- oxided from --.
Column 4, line 20: change "buas" to -- bus -
          line 49: change "spplication" to -- application --;
Column 5, line 3: change "50a-c" to -- 50a-e --;
          line 4: change "47a-c" to -- 47a-e --;
          line 6: change "he" to -- the --;
          line 7: change "50a-c" to -- 50a-e --;
          line 10: change "52a-c" to -- 52a-e --;
          line 11: change "47a-c" to -- 47a-e --;
          line 14: change "56a-c" to -- 56a-e --;
Column 6, line 33: change "receivecontrol" to -- receive control --;
Column 7, line 42: change "anotheris" to -- another is --;
          line 49: change "93a;14e" to -- 93a-3 --;
          line 66: change italicized words "and fuse 94" to -- and fuse 94 -- regularly printed;
          line 68: change "92h" to -- 92b --;
Column 8, line 4: change "94c" to -- 94e --;
          line 13: change "on" to -- or --;
CONTINUED

UNITED STATES PATENT OFFICE
CERTIFICATE OF CORRECTION

Patent No. 4,032,949     Dated June 28, 1977

Inventor(s) Robert W. Bierig

It is certified that error appears in the above-identified patent and that said Letters Patent are hereby corrected as shown below:

Column 8, line 20: change "larege" to -- large --;
Column 9, line 21: change "laters" to -- layers --;
            line 25: change "claim 1" to -- claim 11 --.

Signed and Sealed this

Thirteenth Day of December 1977

[SEAL]

Attest:

RUTH C. MASON
*Attesting Officer*

LUTRELLE F. PARKER
*Acting Commissioner of Patents and Trademarks*